(12) United States Patent
Loibl et al.

(10) Patent No.: US 11,832,399 B2
(45) Date of Patent: Nov. 28, 2023

(54) ELECTRONICS MODULE FOR A TRANSMISSION CONTROL UNIT, AND TRANSMISSION CONTROL UNIT

(71) Applicant: ZF Friedrichshafen AG, Friedrichshafen (DE)

(72) Inventors: Josef Loibl, Bad Abbach (DE); Hermann Josef Robin, Regensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/258,028

(22) PCT Filed: Jul. 3, 2019

(86) PCT No.: PCT/EP2019/067822
§ 371 (c)(1),
(2) Date: Jan. 5, 2021

(87) PCT Pub. No.: WO2020/007901
PCT Pub. Date: Jan. 9, 2020

(65) Prior Publication Data
US 2021/0282280 A1 Sep. 9, 2021

(30) Foreign Application Priority Data
Jul. 5, 2018 (DE) .......................... 102018211105.7

(51) Int. Cl.
*H05K 5/00* (2006.01)
*H05K 1/18* (2006.01)
(Continued)

(52) U.S. Cl.
CPC ........... *H05K 5/0082* (2013.01); *H05K 1/181* (2013.01); *H05K 5/0017* (2013.01);
(Continued)

(58) Field of Classification Search
CPC .. H05K 5/0082; H05K 5/0017; H05K 5/0217; H05K 5/065; H05K 1/181
(Continued)

(56) References Cited

U.S. PATENT DOCUMENTS 6,236,572 B1 * 5/2001 Teshome .............. H05K 1/0219
174/262
8,106,307 B2 * 1/2012 Hayakawa ............. H05K 1/147
174/254
(Continued)

FOREIGN PATENT DOCUMENTS

DE 10 2013 215 368 A1 2/2015
DE 10 2015 205 051 A1 9/2016
(Continued)

OTHER PUBLICATIONS

International Search Report and Written Opinion of the International Search Authority dated Oct. 16, 2019 in International Application No. PCT/EP2019/067822 (English and German languages) (11 pp.).

*Primary Examiner* — Hung S. Bui
(74) *Attorney, Agent, or Firm* — Crowell & Moring LLP

(57) ABSTRACT

An electronics module for a transmission control unit may including one or more of the following: a printed circuit board populated with electronic components that are attached to an upper surface and/or a lower surface of the printed circuit board, and electrically connected thereto, and a media-tight protective layer, which covers one or more electronic components and connecting points between the one or more electronic components and the printed circuit board, where there is a cooling element for cooling the electronic components on one side of the printed circuit board, where the cooling element is connected to the printed circuit board and houses the electronic components that are to be cooled, and where the media-tight protective layer covers a transition region between the printed circuit board and the cooling element along the entire periphery of the cooling element.

18 Claims, 2 Drawing Sheets

(51) Int. Cl.
  *H05K 5/02* (2006.01)
  *H05K 5/06* (2006.01)
  *H05K 7/20* (2006.01)

(52) U.S. Cl.
  CPC ........... *H05K 5/0247* (2013.01); *H05K 5/065* (2013.01); *H05K 7/20854* (2013.01)

(58) Field of Classification Search
  USPC ................................. 361/752, 728, 796, 800
  See application file for complete search history.

(56) References Cited

U.S. PATENT DOCUMENTS

| | | | | |
|---|---|---|---|---|
| 2006/0171127 | A1* | 8/2006 | Kadoya | H01L 25/165 361/752 |
| 2008/0108478 | A1* | 5/2008 | Wetzel | F16H 61/0006 477/36 |
| 2008/0165511 | A1* | 7/2008 | Mayuzumi | H05K 5/0034 29/841 |
| 2015/0022976 | A1* | 1/2015 | Ott | H01L 23/10 361/736 |

FOREIGN PATENT DOCUMENTS

| | | |
|---|---|---|
| DE | 10 2015 217 572 B3 | 3/2017 |
| EP | 1 677 583 A1 | 7/2006 |

* cited by examiner

ELECTRONICS MODULE FOR A TRANSMISSION CONTROL UNIT, AND TRANSMISSION CONTROL UNIT

RELATED APPLICATIONS

This application is a filing under 35 U.S.C. § 371 of International Patent Application PCT/EP2019/067822, filed Jul. 3, 2019, and claiming priority to German Patent Application 10 2018 211 105.7, filed Jul. 5, 2018. All applications listed in this paragraph are hereby incorporated by reference in their entireties.

TECHNICAL FIELD

The present disclosure relates to an electronics module for a transmission control unit in a motor vehicle, and a transmission control unit that has such an electronics module.

BACKGROUND

Electronic control units have become increasingly less expensive while maintaining or increasing their scope of functions. This requires a further development of existing solutions, or the use of novel concepts. The technologies for connecting individual components is of increasing interest, because, as the electronic components become increasingly miniaturized, their vulnerability to contaminants and vibrations increases. This is particularly the case in automotive engineering, in which electronic components must function reliably even in the most adverse conditions.

To protect the electronic circuits and/or electronics modules in the integrated transmission control units from transmission fluid flowing around them, the electronic circuits and/or electronics modules are protected by a protective compound or casting compound.

Such an electronics module is disclosed in DE 10 2015 205 051 A1.

And electronics module is known from the unpublished DE 10 2017 205 216.3, with which a protective lacquer is used to protect the electronic circuits from this transmission fluid.

BRIEF DESCRIPTION OF THE DRAWINGS

Certain embodiments shall be explained in greater detail in reference to the drawings. Therein.

DETAILED DESCRIPTION

Figure 1:
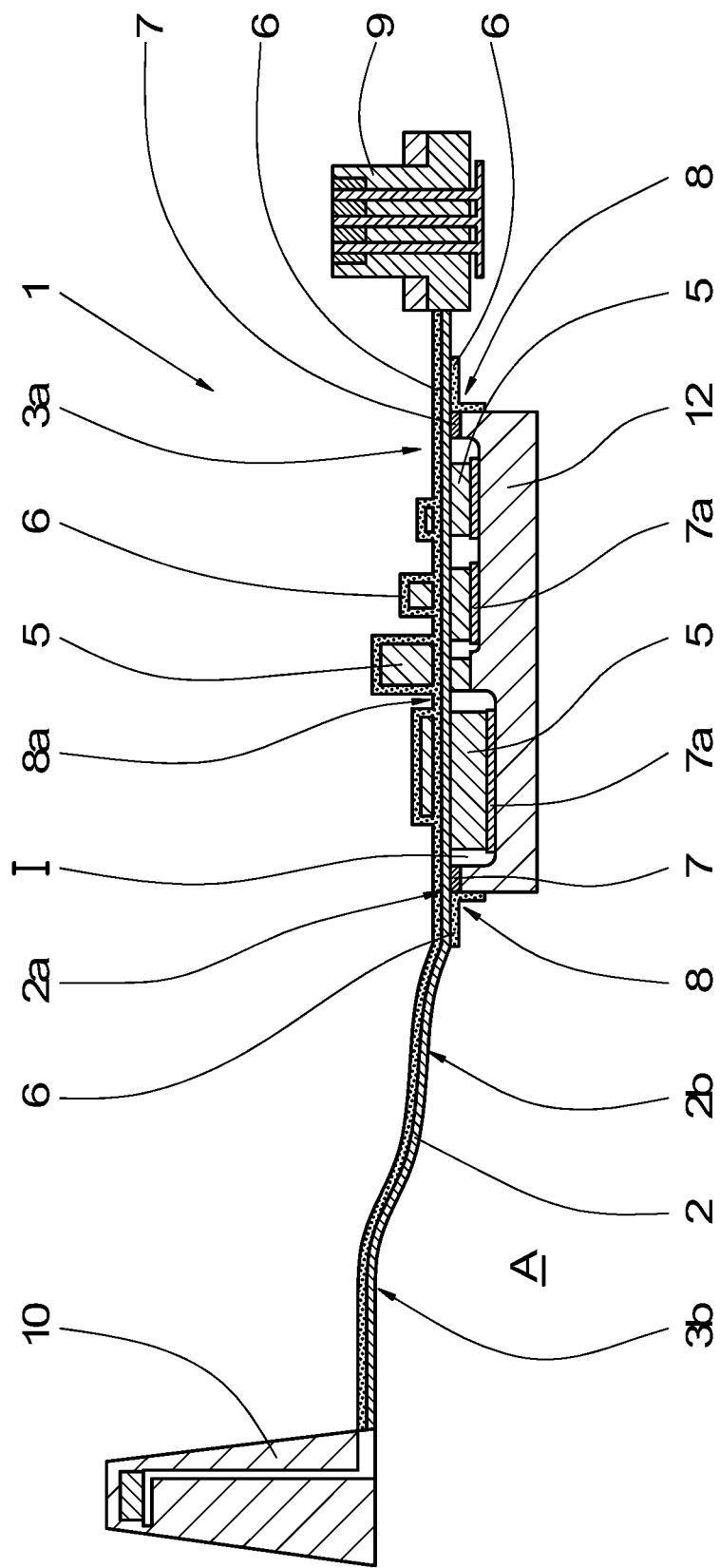
FIG. 1 shows a first exemplary embodiment of an electronics module.

In view of the background above, an aspect of the present embodiments is to create an electronics module for a transmission control unit and a transmission control unit that has an electronics module that is compact and space saving and has adequate cooling for the electronic components in the electronics module while still satisfying the requirements for the operation thereof within a flowing transmission fluid.

Certain embodiments described herein, and variations thereof, can advantageously produce a reliable, liquid-tight and inexpensively produced electronics module for a transmission control unit in a motor vehicle and a transmission control unit that has such an electronics module.

According to a first aspect, an electronics module is proposed for a transmission control unit in a motor vehicle. The electronics module contains a printed circuit board populated with electronic components. These components are attached to an upper and/or lower surface of the printed circuit board, and electrically connected thereto. There is a media-tight protective layer that covers one or more electronic components and connecting points between the one or more electronic components and the printed circuit board.

The electronics module also has a cooling element on one side of the printed circuit board for cooling the electronic components. The cooling element is connected to the printed circuit board and houses the electronic components that are to be cooled therewith. The media-tight protective layer covers a transition region between the printed circuit board and the cooling element along the entire periphery of the cooling element. This ensures that no transmission fluid comes in contact with the connecting points between the cooling element and the printed circuit board, and enters the space surrounded by the cooling element in which the electronic components that are to be protected and cooled are located.

An electronic component is understood to be one or more semiconductor chips grouped together, which are hermetically sealed in a housing, e.g. a plastic housing, from which connecting elements, e.g. conductor paths, protrude. The electronic components can comprise, in particular, semiconductor components with a THT structure (through hole technology) or an SMD structure (surface mounted device). Sensors are also regarded as electronic components.

The cooling element is understood to be a type of housing that houses and comes in contact with the electronic components that are to be cooled, such that a heat transfer from the electronic components to the cooling element can take place.

The protective layer, which can be a formed by a lacquer coating, for example, entirely covers the transition region between the printed circuit board and the cooling element. This transition region is understood to be the region where the cooling element lies on the printed circuit board. In other words, the transition region between the printed circuit board and the cooling element normally contains a gap. This gap is covered or filled by the protective layer, wherein the protective layer covers at least a portion of the cooling element as well as the printed circuit board.

In one embodiment, the cooling element can comprise a collar that runs at least partially along its periphery and lies on the printed circuit board. This increases the contact area between the cooling element and the printed circuit board, such that the seal between an outer chamber filled with transmission fluid and a space encompassed by the cooling element is improved. The protective layer can be placed between the printed circuit board and the collar on the printed circuit board.

The invention makes it possible to obtain an optimal design for the electronics module regarding its structure and shape. Furthermore, fewer parts, as well as mounting and finishing processes, are needed, such that they can be produced more quickly. By using a lacquer, there is no need for the injection or casting compounds used in the prior art.

A simple analysis is enabled with the invention through partially removing the lacquer coating. Furthermore, it enables a simple connection of electronic components, sensor elements, or actuators to the printed circuit board. Further advantages can be derived with regard to an improved thermal connection for cooling the electronic components and the printed circuit board.

An adequate cooling of vulnerable electronic components can be ensured with the invention.

The lacquer coating can be cured by light and/or heat. After applying the lacquer, it is at least partially cured using an appropriate curing device, e.g. using UV light, infrared, and/or a heating oven.

The lacquer can be applied with a dispenser, by spraying, and/or by infusion. It is also possible to apply the lacquer by immersing the printed circuit board in the lacquer. Furthermore, templates or masks can be used to mask sections of the printed circuit board when applying the lacquer. These templates or masks can be affixed to the printed circuit board prior to applying the lacquer, and then removed after the application of the lacquer.

The cooling element can be glued or soldered to the printed circuit board. It is also possible to attach the cooling element to the printed circuit board using rivets, screws, latches or clips. In particular, the connection between the printed circuit board and the cooling element is electrically conductive. This prevents any electrostatic discharges between the printed circuit board and the cooling element.

The cooling element can also be connected to the printed circuit board by means of a thermally conductive adhesive, paste or film, or a thermally conductive connecting means. The cooling element can be made of aluminum, copper, or a thermally conductive metal alloy.

The thermal connection of the electronic components to the cooling element can be obtained by means of a thermally conductive adhesive, paste, or film, or by means of a thermally conductive connecting means. This ensures an optimal heat transfer between the electronic components and the cooling element.

The printed circuit board can be made in part of a rigid printed circuit board element, and in part from a flexible printed circuit board element. In particular, the printed circuit board can have multiple layers. The flexible printed circuit board elements can be made of a flexible film, or formed by deep-milled regions.

According to a second aspect, a transmission control unit for a motor vehicle is proposed that has an electronics module. The transmission control unit has an electronics module according to the first aspect, and a carrier plate, wherein the printed circuit board in the electronics module is placed on the carrier plate, and wherein the transmission control unit is designed to be surrounded by transmission fluid.

FIG. 1 shows a first embodiment of an electronics module. The electronics module 1 contains a printed circuit board 2. The printed circuit board 2 is populated with numerous components on an upper surface 2a and a lower surface 2b. The electronic components 5 have connecting elements (not shown). These connecting elements are connected to contact surfaces (not shown) on the upper surface 2a and lower surface 2b of the printed circuit board 2.

A lacquer coating 6 is applied to sections of the upper surface 2a of the printed circuit board 2. This lacquer coating 6 entirely covers the electronic components 5. In particular, the transition 8a between the electronic components 5 and the printed circuit board 2 is covered with the lacquer coating 6. This ensures that a transmission fluid surrounding the electronic module 1 does not moisten the contact surfaces (not shown) or the housing for the components 5, which could result in damages thereto.

By way of example, a cooling element 12 is located on the lower surface 2b of the printed circuit board 2. As a matter of course, the cooling element 12 can also be placed on the upper surface 2a, or numerous cooling elements can be placed on one or both sides 2a, 2b of the cooling element 2. The connection 7 between the cooling element 12 and the printed circuit board 2 is a form-fitting connection, by way of example. As a matter of course, a rivet, screw, latch, or clip connection, or a combination thereof, can also be used. In particular, the connection 7 is electrically conductive. This ensures a reliable ESD connection, because the formation of electrical potential differences between the printed circuit board 2 and the cooling element is prevented.

The transition region 8 between the cooling element 12 and the printed circuit board 2 is covered by the protective layer 6. The transition region 8 is understood to be the gap formed between the cooling element 12 and the printed circuit board 2 in the connection between the cooling element 12 and the printed circuit board 2. The protective layer 6 is formed along the entire periphery of the cooling element 12, i.e. along the entire gap between the cooling element 12 and the printed circuit board 2. This ensures that no transmission fluid can pass from the outer chamber A into the inner chamber I encompassed by the cooling element 12, in which the components 5 are located.

In FIG. 1, the cooling element 12 forms a housing for the electronic components 5 populating the lower surface 2b of the printed circuit board 2. These components 5 are thermally connected to the cooling element 12, such that an optimal heat transfer from the components 5 to the cooling element 12 can take place. This thermal connection (7a) between the cooling element 12 and the printed circuit board 2 can take place by means of a thermally conductive adhesive, thermally conductive paste, thermally conductive film, or a thermally conductive connecting means.

The printed circuit board 2 is a multilayer printed circuit board 2. The printed circuit board 2 can contain rigid printed circuit board sections 3a and flexible printed circuit board sections 3b. By way of example, a sensor element 10 is located on the flexible printed circuit board section 3b. Such a sensor element 8 can also be placed on a rigid section 3a of the printed circuit board 2.

Figure 2:
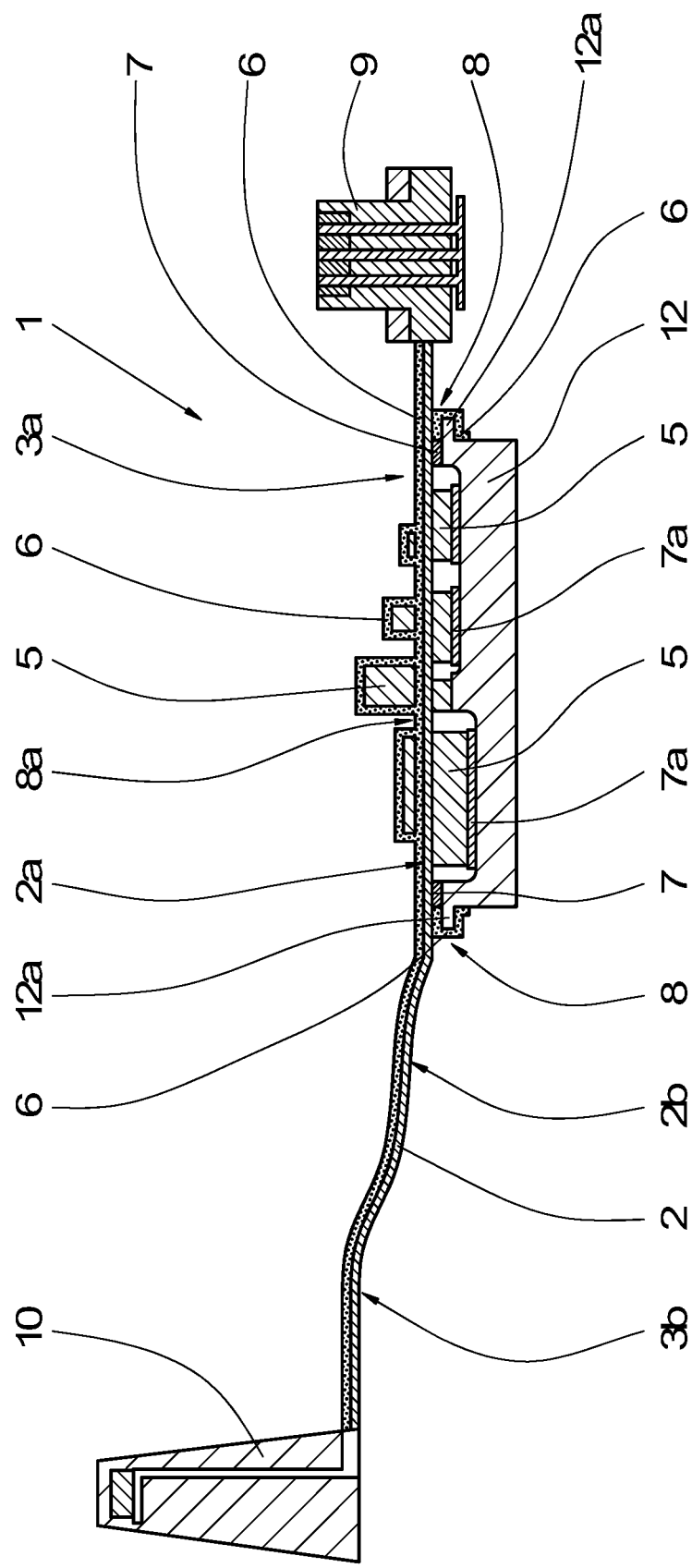
FIG. 2 shows a second exemplary embodiment of an electronics module.

FIG. 2 shows a second embodiment of an electronics module. To avoid repetition, the elements in FIG. 2 are provided with the same reference symbols as those in FIG. 1. The embodiment in FIG. 2 differs from that in FIG. 1 in that the cooling element 12 can have a collar 12a. This collar 12 runs along the periphery of the cooling element 12. This collar 12a offers an enlarged contact area on the lower surface 2b of the printed circuit board 2. A section of the protective layer 6 is formed between the collar 12a on the cooling element 12 and the printed circuit board 2. A connecting element 7 is also formed between the collar 12a and the printed circuit board 2, which attaches the cooling element 12 to the printed circuit board 2.

The protective layer 6 is formed in particular along the entire surface where the cooling element 12 come in contact with the lower surface 2b of the printed circuit board 2. The protective layer 6 also extends along the surface of the cooling element 12 bordering on the contact surface of the cooling element 12. This results in a better seal and a more robust protective layer 6.

REFERENCE SYMBOLS 1 electronics module
2 printed circuit board
2a upper surface of the printed circuit board
2b lower surface of the printed circuit board
5 electronic components
6 lacquer coating 7 connecting element between the cooling element and the printed circuit board
7a connecting element between the cooling element and the electronic components
8 transition region between the cooling element and the printed circuit board
9 plug
10 sensor
12 cooling element
12a collar

The invention claimed is:

1. An electronics module for a transmission control unit, comprising:
a printed circuit board populated with a plurality of electronic components that are attached and electrically connect to at least one of a first surface and a second surface of the printed circuit board;
a first protective layer that is media-tight,
wherein the first protective layer covers each of the electronic components attached to the first surface and connecting points between the one or more electronic components and the printed circuit board attached to the first surface; and
a cooling element covering a portion of the second surface of the printed circuit board and configured for cooling at least one of the electronic components attached to the second surface of the printed circuit board,
wherein the cooling element is connected to the second surface of the printed circuit board and houses the electronic components that are to be cooled,
wherein a second protective layer covers a transition region between the printed circuit board and the cooling element along the entire periphery of the cooling element,
wherein the cooling element has a collar running at least partly along its periphery, wherein the collar is adjacent to the printed circuit board,
wherein a first section of the second protective layer is formed between the collar on the cooling element and the printed circuit board, and wherein a second portion of the second protective layer covers an exterior-facing surface of the collar.

2. The electronics module according to claim 1, wherein the cooling element is glued onto the printed circuit board.

3. The electronics module according to claim 1, wherein the a connection of the cooling element to the printed circuit board is not media-tight, and wherein the connection is covered by the second protective coating.

4. The electronics module according to claim 1, further comprising at least one of a thermally conductive adhesive, paste, and film located between the electronic components and the cooling element.

5. The electronics module according to claim 1, wherein the printed circuit board is formed in part by rigid and in part by flexible printed circuit board elements.

6. The electronics module according to claim 1, wherein the printed circuit board is a multilayer printed circuit board.

7. A transmission control unit comprising an electronics module according to claim 1.

8. The electronics module according to claim 1, wherein the cooling element is soldered onto the printed circuit board.

9. The electronics module according to claim 1, wherein the cooling element connected to the printed circuit board with a rivet.

10. The electronics module according to claim 1, wherein the cooling element connected to the printed circuit board with a screw.

11. The electronics module according to claim 1, wherein the cooling element connected to the printed circuit board with at least one of a latch and a screw.

12. The electronics module according to claim 1, wherein a gap is located between the cooling element and the printed circuit board in the transition region, and wherein the second protective layer extends away from the gap on an outer surface of the cooling element.

13. A transmission control unit comprising:
an electronics module comprising:
a printed circuit board populated with a plurality of electronic components that are attached and electrically connect to at least one of a first surface and a second surface of the printed circuit board;
a first protective layer that is media-tight,
wherein the first protective layer covers all of the electronic components attached to the first surface and connecting points between the one or more electronic components and the printed circuit board attached to the first surface; and
a cooling element covering a portion of the second surface of the printed circuit board and configured for cooling at least one of the electronic components attached to the second surface of the printed circuit board,
wherein the cooling element is connected to the second surface of the printed circuit board and houses the electronic components that are to be cooled, and
wherein a second protective layer covers a transition region between the printed circuit board and the cooling element along the entire periphery of the cooling element; and
a carrier plate,
wherein the printed circuit board in the electronics module is placed on the carrier plate, and
wherein the transmission control unit is designed to be surrounded by transmission fluid.

14. The transmission control unit according to claim 13, wherein the cooling element is glued onto the printed circuit board.

15. The transmission control unit according to claim 13, wherein the connection of the cooling element to the printed circuit board is not media-tight.

16. The transmission control unit according to claim 13, wherein the cooling element has a collar running at least partly along its periphery, and wherein the collar is adjacent to the printed circuit board.

17. The transmission control unit according to claim 16, wherein a section of the protective layer is formed between the collar on the cooling element and the printed circuit board.

18. The transmission control unit according to claim 13, further comprising at least one of a thermally conductive adhesive, paste, and film located between the electronic components and the cooling element.

* * * * *